＝

US012004435B2

United States Patent
Sung et al.

(10) Patent No.: US 12,004,435 B2
(45) Date of Patent: Jun. 4, 2024

(54) TUNABLE RESISTIVE RANDOM ACCESS MEMORY CELL

(71) Applicant: International Business Machines Corporation, Armonk, NY (US)

(72) Inventors: Min Gyu Sung, Latham, NY (US); Soon-Cheon Seo, Glenmont, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 17/804,912

(22) Filed: Jun. 1, 2022

(65) Prior Publication Data

US 2023/0397514 A1    Dec. 7, 2023

(51) Int. Cl.
*G11C 11/00* (2006.01)
*H10B 63/00* (2023.01)
*H10N 70/00* (2023.01)

(52) U.S. Cl.
CPC ......... *H10N 70/8418* (2023.02); *H10B 63/30* (2023.02); *H10N 70/063* (2023.02); *H10N 70/828* (2023.02); *H10N 70/8833* (2023.02)

(58) Field of Classification Search
CPC .................................................. H10N 70/828
USPC ......................................................... 365/148
See application file for complete search history.

(56) References Cited

U.S. PATENT DOCUMENTS 9,349,950 B2   5/2016  Walls
9,444,040 B2   9/2016  Sato
10,439,134 B2   10/2019  Majhi
11,088,203 B2   8/2021  Hsieh
2016/0359108 A1*  12/2016  Majhi .................. H10N 70/066
2020/0357851 A1   11/2020  Sung
2021/0028229 A1   1/2021  Zhang
2021/0135107 A1   5/2021  Kim

OTHER PUBLICATIONS

Beckmann, et al., "The effect of reactive ion etch (RIE) process conditions on ReRAM device performance." Published Aug. 24, 17 by IOP Publishing. 10 pages. In 2017 Semicond. Sci. Technol. 32 095013. https://iopscience.iop.org/article/10.1088/1361-6641/aa7eed.
Keswani, et al., "Chapter 4: Post CMP Cleaning, Developments in Surface Contamination and Cleaning, vol. Viii Wet and Dry Cleaning Methods." Published Jan. 2015 by ResearchGate. 40 pages. https://www.researchgate.net/publication/274253389.
Sung, et al., "Development of 1T-1R cross bar test vehicle for RRAM Technology on 300mm wafers." In 8th International Symposium on Advanced Gate Stack Technology, Bolton Landing (USA), Oct. 19-21, 2011. 20 pages.

* cited by examiner

*Primary Examiner* — Hoai V Ho
(74) *Attorney, Agent, or Firm* — Matthew Zehrer

(57) ABSTRACT

A method of manufacturing an RRAM cell includes forming a first wire, forming an insulator on the first wire, the insulator having a pore and an insulator surface, and forming a first electrode layer on the first wire and the insulator, the first electrode having an electrode surface. The method further includes recessing the first electrode layer such that the electrode surface is recessed toward the first wire from the insulator surface, forming a switching layer on the insulator and the first electrode, and forming a second electrode on the switching layer.

20 Claims, 9 Drawing Sheets

(Operation 206)

(Operation 208)

(Operation 214)

(Operation 216)

(Operation 218)

(Operation 220)

US 12,004,435 B2

TUNABLE RESISTIVE RANDOM ACCESS MEMORY CELL

BACKGROUND

The present invention relates to computer memory, and more specifically, to resistive random access memory devices.

Resistive random access memory (RRAM or ReRAM) can be utilized for both training and inference in analog computing for artificial intelligence. The RRAM structures can include a switching layer comprised of a high dielectric constant (high-K) material. A switching layer can be formed, set, reset, and read by applying various electrical biases across the switching layer. These actions can change the electrical resistance of an RRAM cell that contains the switching layer, which allows the RRAM cell to function as a memory cell. Such RRAM cells are non-volatile and can operate via analog switching, so they can be useful for many applications, such as, for example, artificial intelligence and machine learning.

SUMMARY

According to an embodiment of the present disclosure, a method of manufacturing an RRAM cell includes forming a first wire, forming an insulator on the first wire, the insulator having a pore and an insulator surface, and forming a first electrode layer on the first wire and the insulator, the first electrode having an electrode surface. The method further includes recessing the first electrode layer such that the electrode surface is recessed toward the first wire from the insulator surface, forming a switching layer on the insulator and the first electrode, and forming a second electrode on the switching layer.

According to an embodiment of the present disclosure, an RRAM cell includes a first electrode, a switching layer electrically connected to the first electrode, and a second electrode electrically connected to the switching layer. The switching layer has a stepped-bell shape.

According to an embodiment of the present disclosure, a method of manufacturing an RRAM cell includes forming a first wire, forming an insulator on the first wire, the insulator having a pore and an insulator surface, and forming a first electrode on the first wire and the insulator, the first electrode having an electrode surface. The method further includes forming a plug in the first electrode the first electrode layer, the plug having a plug surface, wherein the electrode surface and the plug surface are recessed toward the first wire from the insulator surface, removing the plug, forming a switching layer on the insulator and the first electrode, and forming a second electrode on the switching layer.

DETAILED DESCRIPTION

Figure 1A:
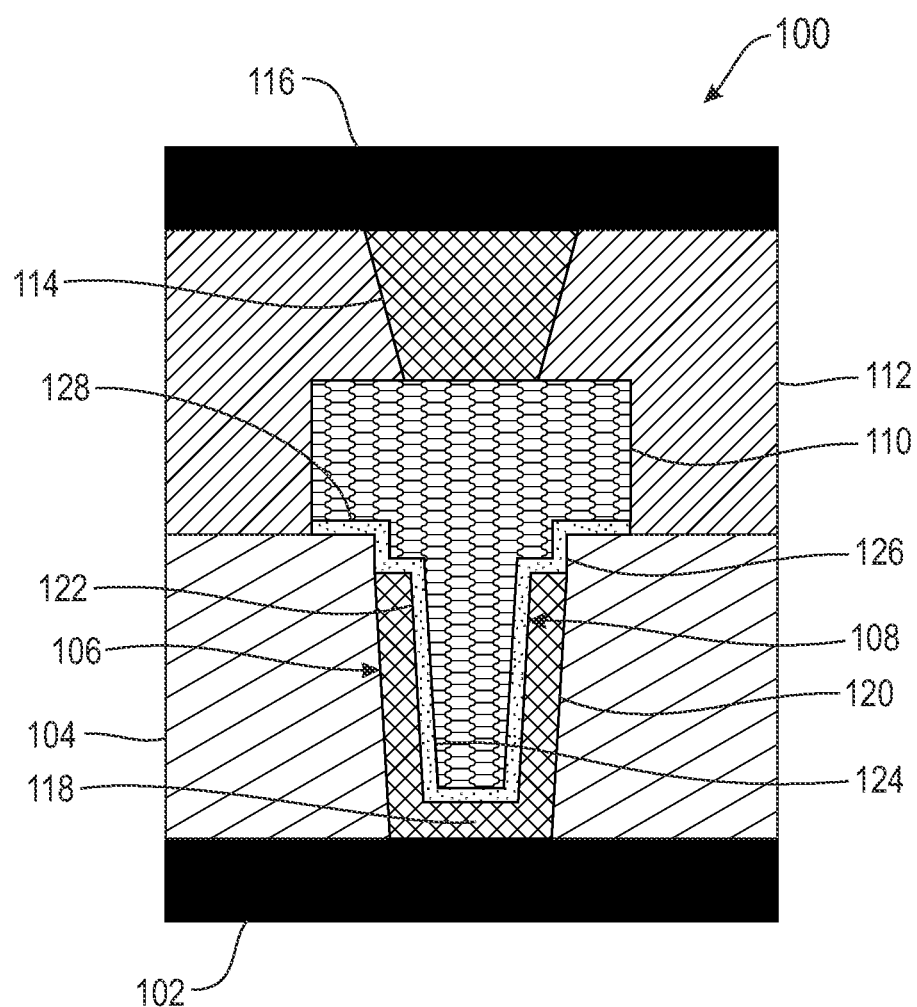
FIG. 1A is a cross-section view of an RRAM cell, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing Figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide ($SiO_2$), silicon nitride (SiN), etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light-sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1B:
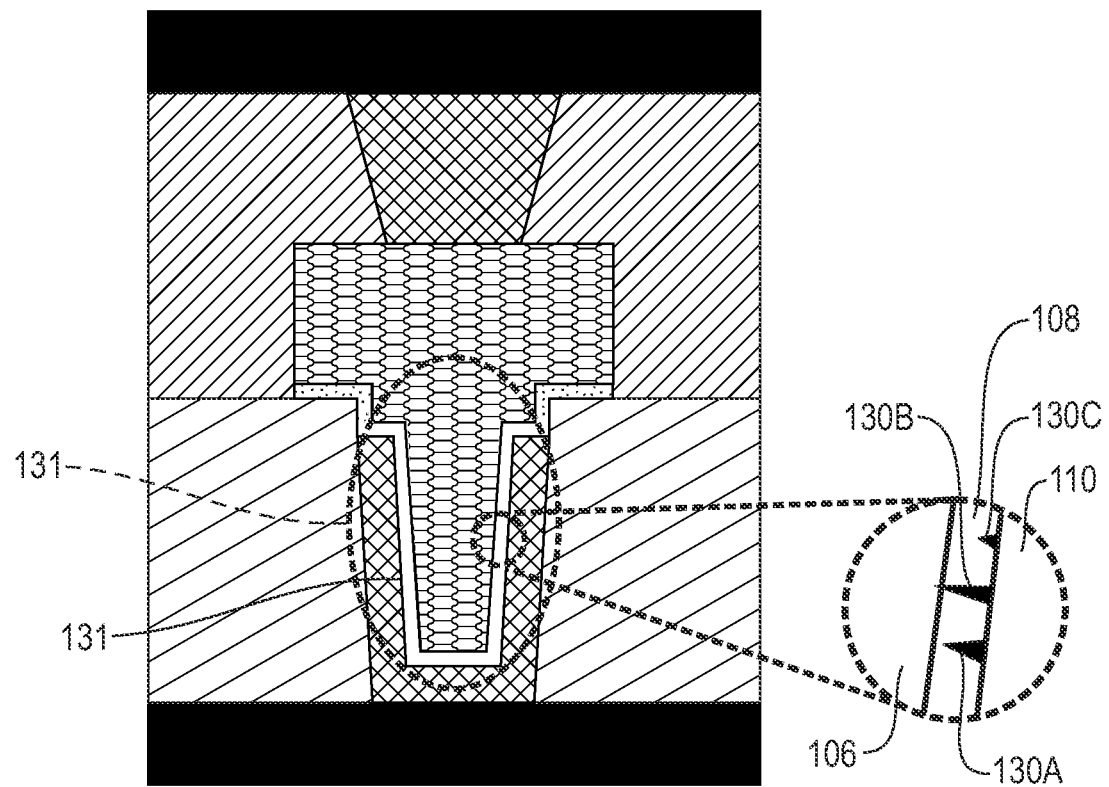
FIG. 1B is a cross-section view of the RRAM cell of FIG. 1A including filaments, in accordance with an embodiment of the present disclosure.

FIGS. 1A and 1B are cross-section views of RRAM cell 100 for use in, for example, an IC (not shown). In the illustrated embodiment, RRAM cell 100 comprises bottom wire 102, insulator 104, bottom electrode 106, switching material 108, top electrode 110, insulator 112, via 114, and top wire 116.

In the illustrated embodiment, the bottom of bottom electrode 106 is in direct contact with and electrically connected to the top of bottom wire 102, which can receive electrical signals from other components (not shown) of the IC. Bottom electrode 106 has a U-shape with base 118 and wall 120 extending upwards from the base forming trench 122 therebetween. In addition, wall 120 does not extend all the way up to the top of insulator 104, so there is a step therebetween. Switching material 108 has a stepped-bell shape with a U-shaped cup 124 (at the bottom), an L-shaped rim 126 (at the step), and a flat disc 128 (on top of insulator 104). The exterior of cup 124 is in direct contact with and electrically connected to the interiors of base 118 and wall 120, and the bottom, horizontal side of rim 126 is in direct contact with and electrically connected to the top of wall 120. Top electrode 110 has a shape corresponding to that of switching material 108, and the bottom of top electrode 110 is in direct contact with and electrically connected to the interior and top of switching material 108. The bottom of via 114 is in direct contact with and electrically connected to the top of top electrode 110, and the bottom of top wire 116 is in direct contact with and electrically connected to the top of via 114. Top wire 116 can deliver electrical signals from RRAM cell 100 to other components (not shown) of the IC.

In the illustrated embodiment, insulators 104 and 112 structurally support and electrically isolate the other components of RRAM cell 100, selectively, and fill in the space therebetween, as appropriate. Thus, the exterior of wall 120 and the upper, vertical side of rim 126 are in direct contact with and laterally surrounded by insulator 104, and the bottom sides of disc 128 and insulator 112 are in direct contact with the top of insulator 104. In addition, the exterior of disc 128, top electrode 110, and via 114 are in direct contact with and laterally surrounded by insulator 112, and the bottom side of top wire 116 is in direct contact with the top of insulator 112. Furthermore, a cross-section of various components and/or the entirety of RRAM cell 100 (into the page in FIG. 1A) can be circular, although in other embodiments, it can be rectangular, square, oval, or any other suitable shape.

In the illustrated embodiment, bottom electrode 106, top electrode 110, and via 114 are comprised of a very electrically conductive material, such as metal or metallic compound, for example, titanium nitride (TiN) or tungsten (W). In the illustrated embodiment, insulators 104 and 112 are comprised of a dielectric (electrically insulating) material, such as, for example, SiN, $SiO_2$, silicon nitride carbide (SiNC), or tetraethyl orthosilicate (TEOS). In some embodiments, both insulators 104 and 112 are the same material, and in other embodiments, different materials are used.

In the illustrated embodiment of FIG. 1B, switching material 108 is composed essentially of a transition metal oxide. In some embodiments, switching material 108 is composed essentially of a high dielectric constant (high-κ) material, such as, for example, hafnium oxide ($HfO_2$), aluminum oxide ($Al_2O_3$), tantalum oxide ($Ta_2O_5$), nickel oxide (NiO), and/or $SiO_2$. The terms "composed essentially" and "consist essentially," as used herein with respect to materials of different layers, indicates that other materials, if present, do not materially alter the basic characteristics of the recited materials. For example, a switching material 108 consisting essentially of a high-κ transition metal oxide material does not include other materials that materially alter the basic characteristics of the high-κ transition metal oxide material.

In the illustrated embodiment, RRAM cell 100 can be operated as a memory cell by first forming filaments 130A-130C (collectively "filaments 130") across switching material 108. Filaments 130 can be formed by applying a relatively large voltage across switching material 108 (i.e., causing an electrical bias between bottom electrode 106 and top electrode 110). Filaments 130 are randomly formed in the switching area 131 of switching material 108, which is the region between bottom electrode 106 and top electrode 110 (and is shown without the hatching pattern from the rest of switching material 108 in FIG. 1B). In RRAM cell 100, switching area 131 would be cup 124 and the bottom of rim 126. In some embodiments, there are thousands to millions of filaments 130, although only three have been shown for the sake of simplicity. During the formation of filaments 130, local dielectric breakdowns occur in switching material 108. More specifically, local oxide vacancies form (e.g., $HfO_{(2-x)}$) where switching material 108 behaves like it is a metallic material. Thereby, filaments 130 are pathways of low electrical resistance within switching layer 108. Filaments 130 will grow from one electrode towards the other depending on the polarity, which are shown in FIG. 2B as going from bottom electrode 106 towards top electrode 110.

In the absence of filaments 130, there is a relatively high electrical resistance through switching material 108. However, a single (or multiple) filament 130 (in this example, filament 130B) extends all the way across switching material 108 such that it is in direct contact with and electrically connected to both bottom electrode 106 and top electrode 110. Because filament 130B is an electrically conductive pathway through switching material 108, switching material 108 goes from having a relatively high electrical resistance to having a relatively low electrical resistance. This difference in the electrical resistance across switching material 108 leads to substantial difference in the electrical resistance across RRAM cell 100 (i.e., between bottom wire 102 and top wire 116). The initial growth of filaments 130 is known as "forming" and can be performed, for example, using a relatively high voltage in the 2 volt (V) to 3 V range. In some embodiments, the thickness of switching material 108 is 10 nanometers (nm) and the area of switching material 108 is 2500 nm$^2$. Prior to formation of any filaments 130, a 1 V difference across switching material 108 would yield a current of around $1.5\times10^{-9}$ amperes (A).

Once filament 130B is formed, it can be controlled with relatively moderate voltages/electrical biases across switching material 108. For example, if the polarity of the electrical bias is opposite to that of the forming voltage difference, then filaments 130 (including filament 130B) will recede. This can undo the bridging that filament 130B previously performed between bottom electrode 106 and top electrode 110. At that point, the electrical resistance across switching material 108 would change to a relatively high value, as would the electrical resistance across RRAM cell 100. The reduction of filaments 130 that breaks the connection of filament 130B to top electrode 110 is known as "resetting" or "erasing", and RRAM cell 100 is considered to be "off". Resetting RRAM cell 100 can be performed, for example, using a relatively moderate voltage in the (−)0.5 V to (−)1 V range.

On the other hand, if the polarity of the electrical bias is subsequently switched to be the same as that of the forming voltage difference, then filaments 130 (including filament 130B) will grow again. This can allow filament 130B (or another one of filaments 130) to grow all the way across switching material 108, rejoining bottom electrode 106 and top electrode 110 with a relatively low electrical resistance pathway. At that point, the electrical resistance across switching material 108 would change to a relatively low value, as would the electrical resistance across RRAM cell 100. The growth of filaments 130 that makes the connection of filament 130B to top electrode 110 is known as "setting" or "writing", and RRAM cell 100 is considered to be "on". Setting RRAM cell 100 can be performed, for example, using a relatively moderate voltage in the 0.5 V to 1 V range.

To read the data stored in RRAM cell 100, a relatively low voltage that is less than 0.5 V can be applied across RRAM cell 100 so that its electrical resistance can be measured. If the reading is relatively low, then RRAM cell 100 is "on", but if the reading is relatively high, then RRAM cell is "off". In some embodiments, the thickness of switching material 108 is 10 nm and the area of switching material 108 is 2500 nm$^2$. Once filament 130B is set, a 0.25 V difference across switching material 108 would yield a current of around $1.5\times10^{-4}$ A. On the other hand, once filament 130B is reset, a 0.25 V difference across switching material 108 would yield a current of around $1.5\times10^{-5}$ A (e.g., around ten times less than when filament 130B is set). The current through switching material 108, when filament 130B is set, can be manipulated by the drain current of its corresponding transistor. In addition, filament 130B is created by voltage driven stress, so its current load can be dependent on the initial forming voltage. Furthermore, other embodiments having different switching materials and/or switching material thicknesses can have different current values (and related resistance values). Thereby, RRAM cell 100 can be configured differently for different applications, as desired.

The forming, setting, resetting, and reading voltages provided above are merely from one exemplary embodiment. In other embodiments, these values can be different. Furthermore, for example, the forming voltage can be adjusted to for a given implementation. The required forming voltage can depend on the size of switching area 131 and the electrical resistance of the original, undeveloped switching material 108. It can be beneficial to accommodate a higher density of RRAM cells 100 in an IC, but as the size of switching area 131 decreases, the forming voltage will increase. Unfortunately, this results in increased power consumption and heating. To lower the forming voltage, switching material 108 can be treated during or after formation to increase the ability of electrical current to leak through switching material 108. However, this can cause switching material 108 to be overly sensitive since both the forming and switching voltages can be lowered too much. Instead, according to the present disclosure, the forming voltage can be adjusted by changing the height of wall 120. More specifically, increasing the height of wall 120 increases switching area 131 of switching material 108. This reduces the forming voltage without increasing the electrical leakage of switching material 108 and without increasing the lateral width of RRAM cell 100 (as would be required with a planar switching material 108).

Figure 2:
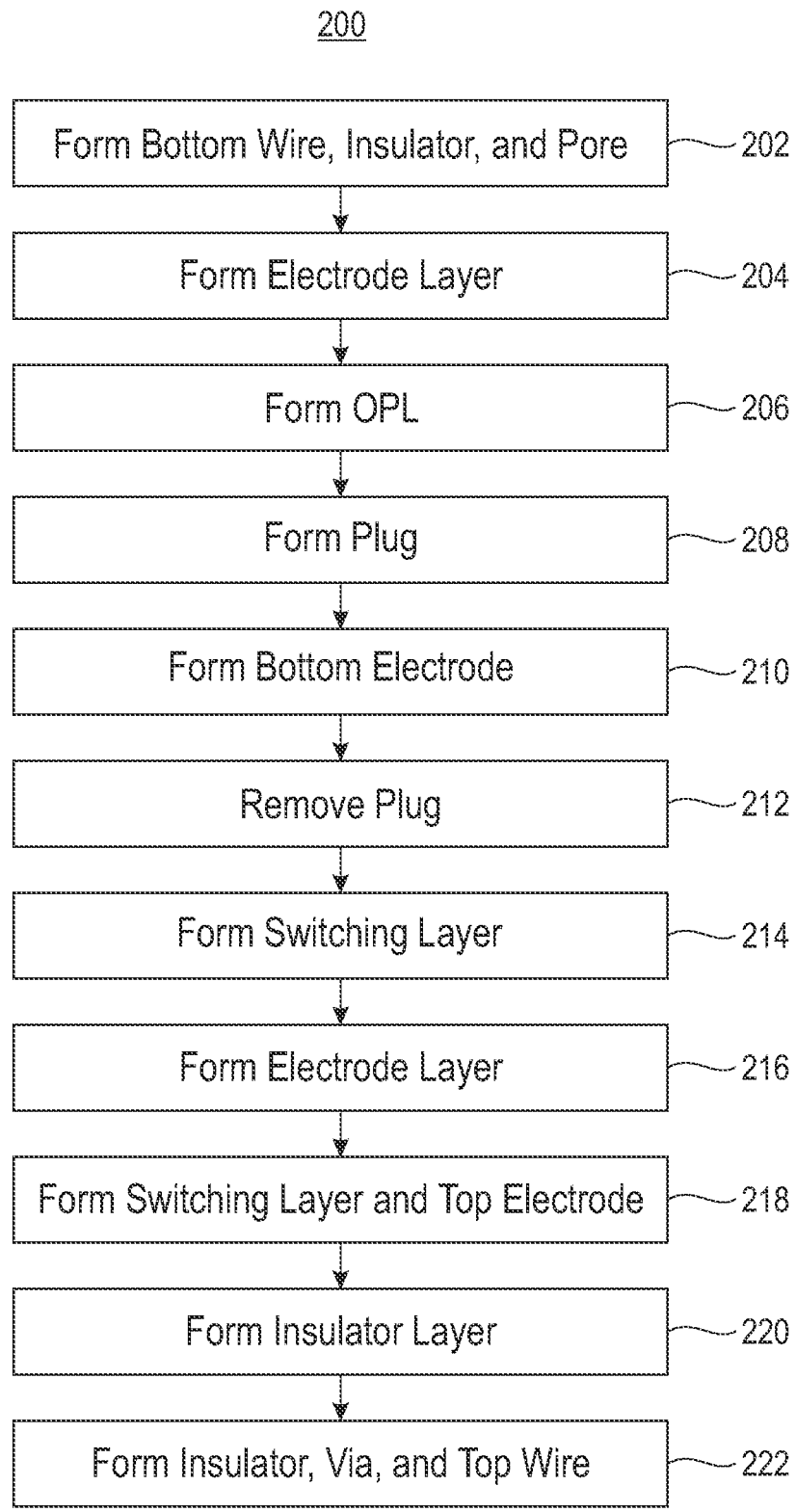
FIG. 2 is a flowchart of a method of manufacturing the RRAM cell of FIG. 1A, in accordance with an embodiment of the present disclosure.
Figure 3A:
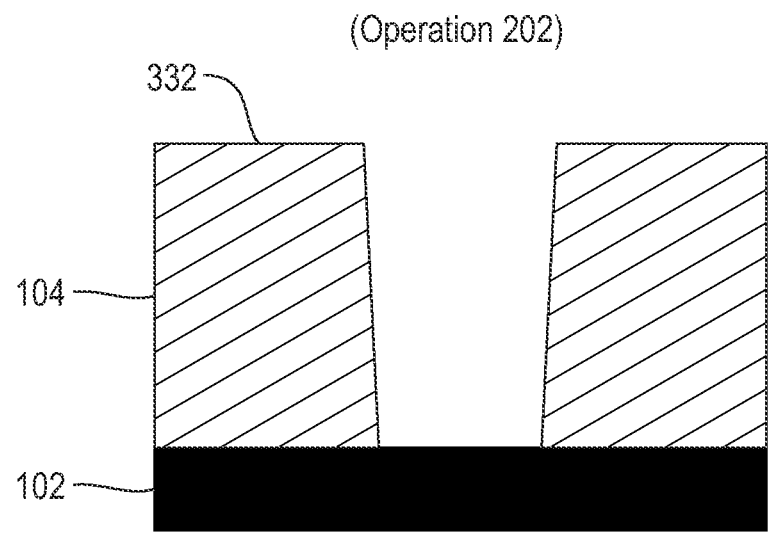
FIGS. 3A-3K are a series of cross-section views of the method of FIG. 2 of manufacturing the RRAM cell, in accordance with an embodiment of the present disclosure.
Figure 3B:
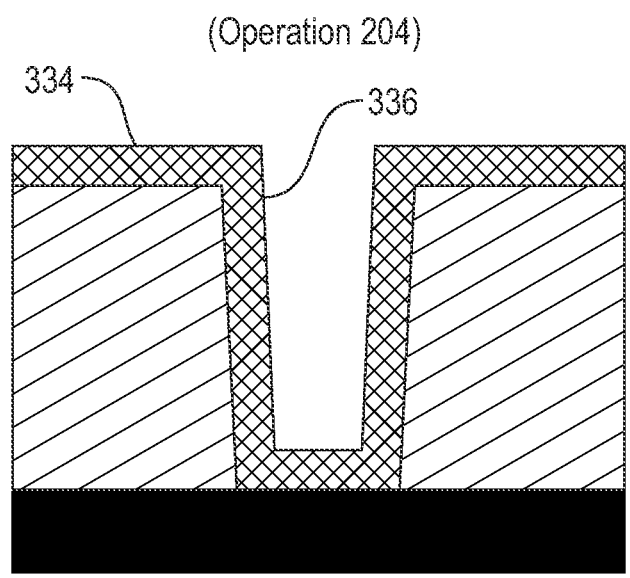
Figure 3C:
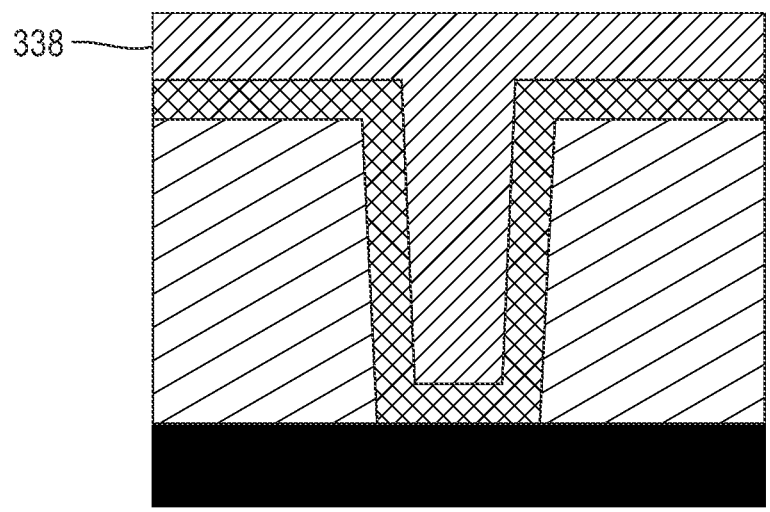
Figure 3D:
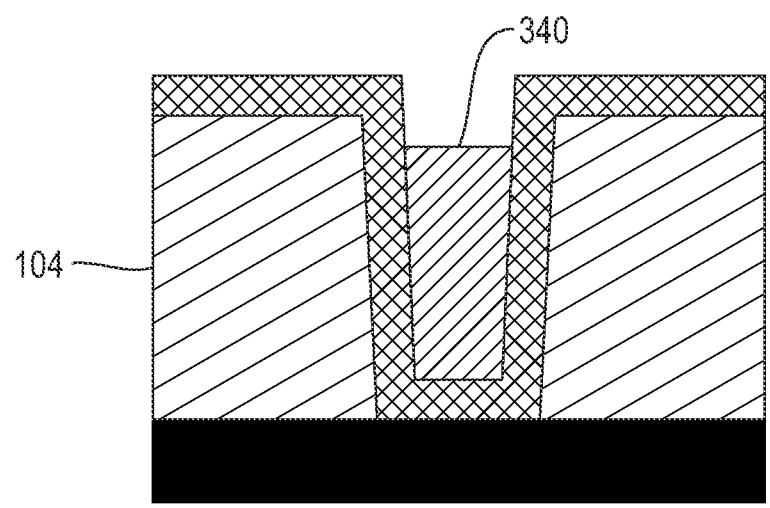
Figure 3E:
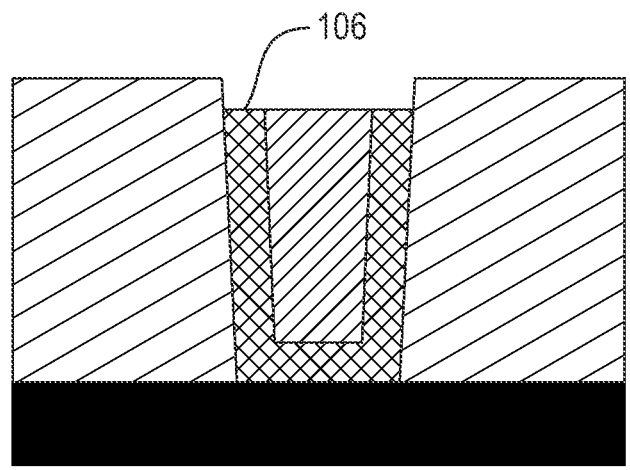
Figure 3F:
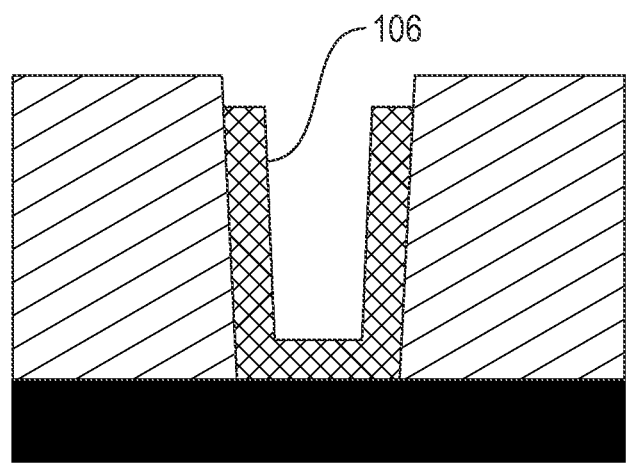
Figure 3G:
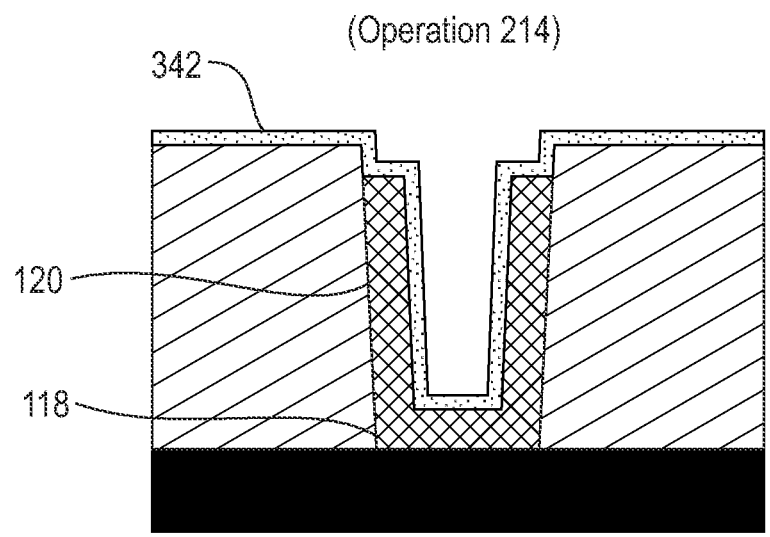
Figure 3H:
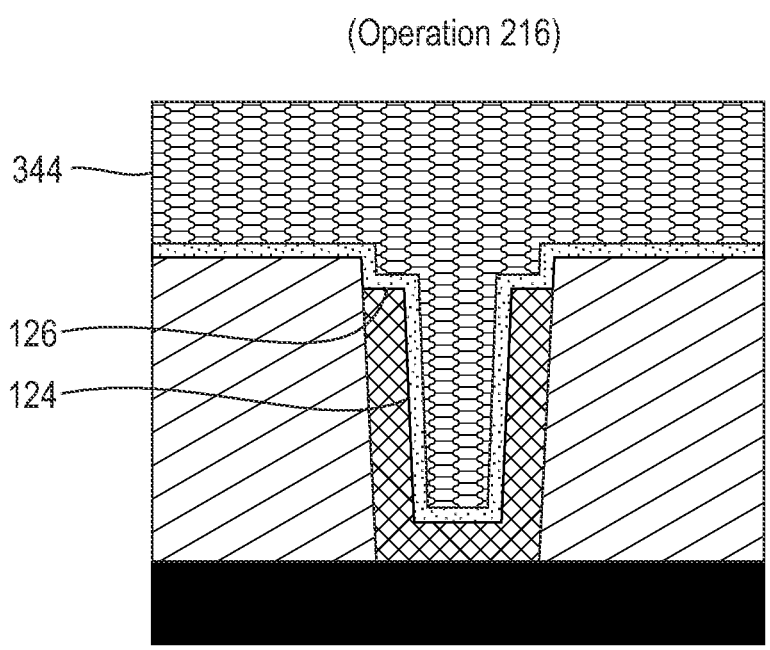
Figure 3I:
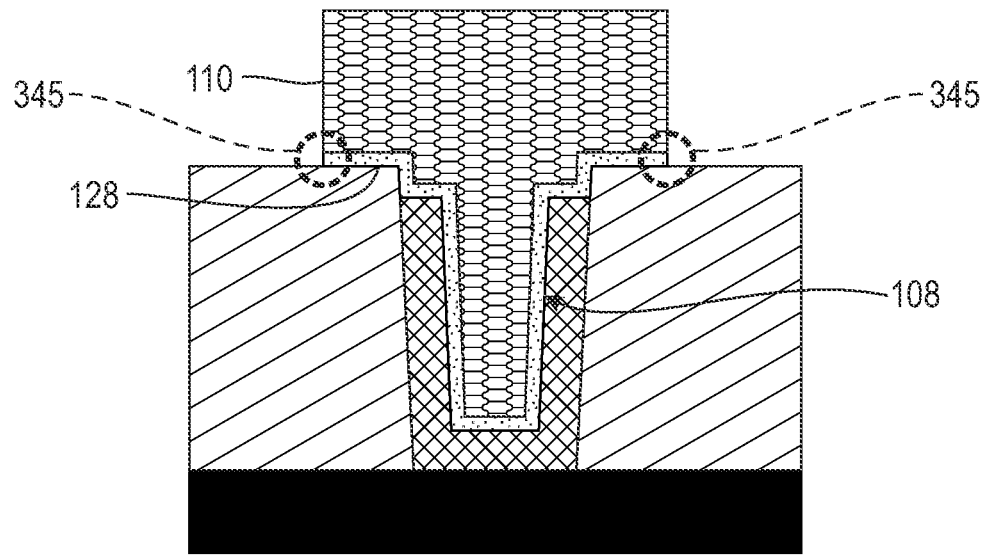
Figure 3J:
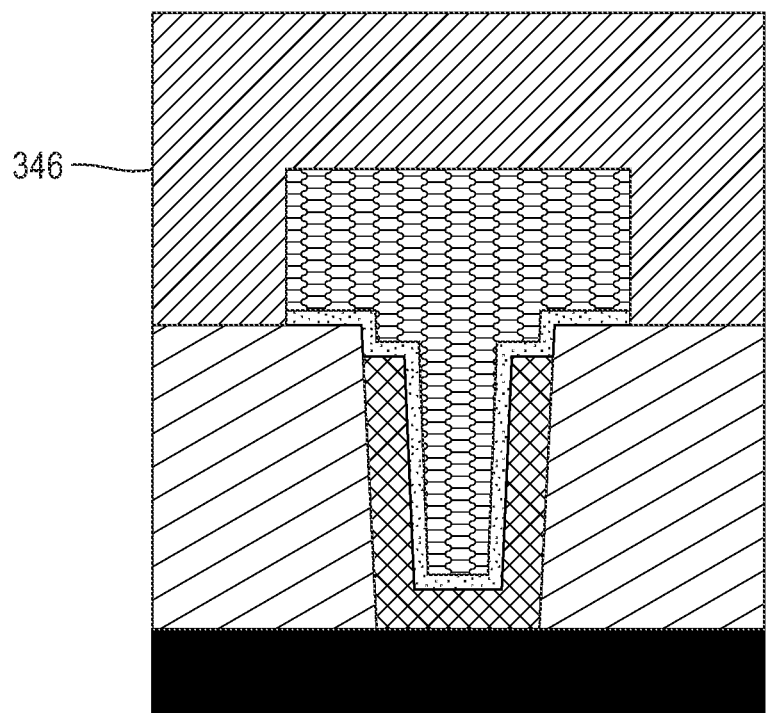
Figure 3K:
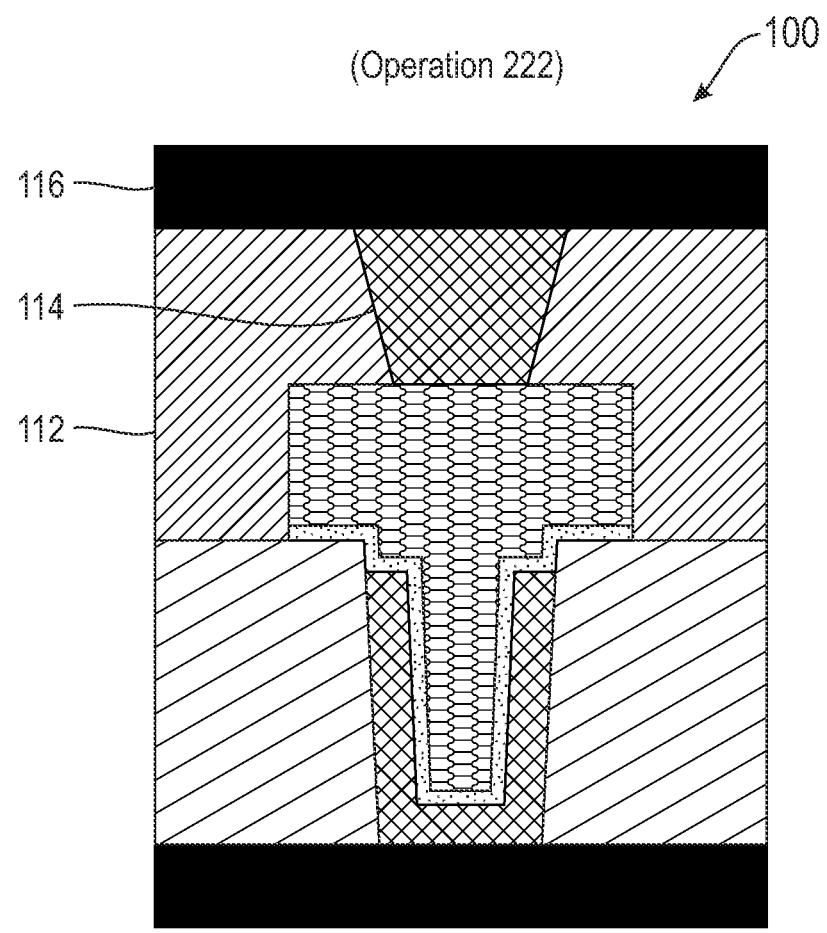

FIG. 2 is a flowchart of method 200 of manufacturing RRAM cell 100. FIGS. 3A-3K are a series of views of method 200 of manufacturing RRAM cell 100. FIGS. 2 and 3A-3K will now be discussed in conjunction with one another wherein each operation of method 200 is illustrated by one of FIGS. 3A-3K. In addition, during this discussion, references may be made to features of RRAM cell 100 shown in FIGS. 1A and/or 1B.

In the illustrated embodiment, method 200 starts at operation 202, wherein bottom wire 102 and insulator 104 are formed, the latter of which includes pore 332. At operation 204, electrode layer 334 is formed on bottom wire 102 and insulator 104. Electrode layer 334 can include a conformal material, so electrode layer 334 extends along the sides of pore 332 and includes trench 336. At operation 206, organic planarization layer (OPL) 338 is formed on electrode layer 334 which fills trench 336. At operation 208, some of OPL 338 (a.k.a., the plug layer) is removed to form plug 340, the top surface of which is below the top surface of insulator 104. This removal is performed by, for example, an RIE process which subsequently exposes some of electrode layer 334. Such a process can selectively remove the OPL material compared to the electrode material, and the amount of OPL material removal can be controlled. Therefore, the height of plug 340 can be controlled, for example, to be recessed below the top surface of insulator 104 by at least 10% of the height of plug 340.

At operation 210, the exposed portion of electrode layer 334 is removed to form bottom electrode 106, the top surface of which that is recessed down from the top surface of insulator 104. More specifically, the removal process selects the electrode material compared to the OPL material, so the top surface of bottom electrode 106 is even with the top surface of plug 340 because plug 340 protects bottom electrode 106 from being etched. Thereby, the height of bottom electrode 106 is determined by the height of plug 340. At operation 212, plug 340 is removed using a process that can selectively remove the OPL material compared to the electrode material. At operation 214, switching layer 342 is formed on insulator 104 and bottom electrode 106. Switching layer 342 includes a conformal material, so switching layer 342 extends along base 118 and wall 120. In some embodiments, switching layer 342 has a thickness of 10 nm or less.

At operation 216, electrode layer 344 is formed on switching layer 342. Electrode layer 344 can include a conformal material, so electrode layer 344 extends along the sides of cup 124 and rim 126. At operation 218, excess portions of switching layer 342 and electrode layer 344 are removed, for example, using a RIE process, which exposes insulator 104 and forms switching material 108 (including disc 128) and top electrode 110. At operation 220, insulator layer 346 is formed on insulator 104, switching material 108, and top electrode 110. At operation 222, a pore in insulator layer 346 is formed, which forms insulator 112. In addition, via 114 is formed in the pore of insulator layer 346, and top wire 116 is formed on insulator 112 and via 114 to complete RRAM cell 100.

The operations of method 200 can be beneficial for a number of reasons. For example, the forming voltage of RRAM cell 100 can be tuned by adjusting the height of switching material 108 at operation 208 (i.e., the step where the height of bottom electrode 106 is determined). This is done without relying on lithography, and it can be used in to compensate for changes being made to switching material 108 (e.g., material composition or thickness) without changing the footprint of RRAM cell 100. For another example, a CMP process is not required to make RRAM cell 100, which saves time and money. For another example, bottom electrode 106 is only exposed during a single etching step (at operation 212), which prevents additional damage to bottom electrode 106 that could cause, for example, switching degradation.

For yet another example, residue can be produced as a byproduct of the RIE process at operation 218. This residue can be situated along the outer side of top electrode 110 and disc 128 (i.e., in the area indicated by phantom circles 345), and the residue can be electrically conductive material from top electrode 110. In some conventional RRAM cells, the residue can short circuit the bottom electrode to the top electrode, bypassing the switching material. However, RRAM cell 100 avoids this issue since any residue along the outer edge of top electrode 110 is prevented from contacting bottom electrode 106 by a substantial amount of insulator 104 and switching material 108.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a resistive random access memory (RRAM) cell, the method comprising:
    forming a first wire;
    forming an insulator on the first wire, the insulator having a pore and an insulator surface;
    forming a first electrode layer on the first wire and the insulator, the first electrode having an electrode surface;
    recessing the first electrode layer such that the electrode surface is recessed toward the first wire from the insulator surface;
    forming a switching layer on the insulator and the first electrode; and
    forming a second electrode on the switching layer.

2. The method of claim 1, further comprising forming a plug in the first electrode layer prior to recessing the first electrode layer, the plug having a plug surface that is recessed toward the first wire from the insulator surface.

3. The method of claim 2, further comprising removing the plug prior to forming the switching layer.

4. The method of claim 2, wherein:
    the switching layer is comprised of a transition metal oxide material; and
    the plug is comprised of an organic planarization layer material.

5. The method of claim 1, further comprising forming a plug layer on the first electrode layer prior to recessing the first electrode layer.

6. The method of claim 5, wherein recessing the first electrode layer uses a process that is selective for the first electrode layer compared to the plug layer.

7. The method of claim 5, further comprising recessing the plug layer to form a plug prior to recessing the first electrode layer.

8. The method of claim 7, wherein recessing the plug layer uses a process that is selective for the plug layer compared to the first electrode layer.

9. The method of claim 8, further comprising removing the plug after recessing the first electrode layer.

10. The method of claim 1, further comprising removing excess portions of the switching layer and the second electrode.

11. The method of claim 10, further comprising forming a second insulator on the first insulator, the switching layer, and the second electrode.

12. The method of claim 1, further comprising forming a second wire that is electrically connected to the second electrode.

13. A resistive random access memory (RRAM) cell comprising:
    a first electrode;

a switching layer electrically connected to the first electrode;

a second electrode electrically connected to the switching layer;

wherein the switching layer has a stepped-bell shape comprising:
- a cup portion having a U-shape;
- a rim portion having an L-shape and being connected to the cup portion; and
- a disc portion having a flat shape and being connected to the rim portion.

14. The RRAM cell of claim 13, further comprising:

a first insulator laterally surrounding the first electrode, the first insulator having an insulator surface;

a second insulator laterally surrounding the second electrode;

wherein the first electrode includes an electrode surface that is recessed from the insulator surface.

15. The RRAM cell of claim 14, wherein:

the cup portion is in direct contact with solely the first electrode and the second electrode;

the rim portion is in direct contact with the first electrode, the second electrode, and the first insulator; and the disc portion is in direct contact with the second electrode, the second insulator, and the insulator surface of the first insulator.

16. The RRAM cell of claim 13, further comprising:

a first wire electrically connected to the first electrode; and a second wire electrically connected to the second electrode.

17. An integrated circuit comprising the RRAM cell of claim 16.

18. A method of manufacturing a resistive random access memory (RRAM) cell, the method comprising:

forming a first wire;

forming an insulator on the first wire, the insulator having a pore and an insulator surface;

forming a first electrode on the first wire and the insulator, the first electrode having an electrode surface;

forming a plug in the first electrode the first electrode layer, the plug having a plug surface, wherein the electrode surface and the plug surface are recessed toward the first wire from the insulator surface;

removing the plug;

forming a switching layer on the insulator and the first electrode; and forming a second electrode on the switching layer.

19. The method of claim 18, wherein:

the plug is comprised of an organic planarization layer material; and the switching layer is comprised of a transition metal oxide material.

20. The method of claim 18, wherein forming the first electrode comprises:

forming an electrode layer; and recessing the electrode layer to form the first electrode prior to removing the plug.

* * * * *